(12) United States Patent
Kosowsky (10) Patent No.: US 7,825,491 B2
(45) Date of Patent: Nov. 2, 2010

(54) LIGHT-EMITTING DEVICE USING VOLTAGE SWITCHABLE DIELECTRIC MATERIAL

(75) Inventor: Lex Kosowsky, San Jose, CA (US)

(73) Assignee: Shocking Technologies, Inc., San Jose, CA (US)

( * ) Notice: Subject to any disclaimer, the term of this patent is extended or adjusted under 35 U.S.C. 154(b) by 710 days.

(21) Appl. No.: 11/562,289

(22) Filed: Nov. 21, 2006

(65) Prior Publication Data

US 2007/0126018 A1 Jun. 7, 2007

Related U.S. Application Data

(60) Provisional application No. 60/740,961, filed on Nov. 30, 2005, provisional application No. 60/739,725, filed on Nov. 22, 2005.

(51) Int. Cl.
    *H01L 23/62* (2006.01)
(52) U.S. Cl. .................... 257/530; 257/50; 257/529; 257/E23.147; 338/21; 313/580
(58) Field of Classification Search ............... 257/50, 257/529, 530, E23.147; 313/580; 338/21
See application file for complete search history.

(56) References Cited

U.S. PATENT DOCUMENTS

| | | | |
|---|---|---|---|
| 3,347,724 A | 10/1967 | Schneble, Jr. et al. | |
| 3,685,026 A | 8/1972 | Wakabayashi et al. | |
| 3,685,028 A | 8/1972 | Wakabayashi et al. | |
| 3,723,635 A | 3/1973 | Smith | |
| 3,808,576 A | 4/1974 | Castonguay et al. | |
| 3,926,916 A | 12/1975 | Mastrangelo | |
| 3,977,957 A | 8/1976 | Kosowsky et al. | |
| 4,113,899 A | 9/1978 | Henry et al. | |
| 4,133,735 A | 1/1979 | Afromowitz et al. | |
| 4,252,692 A | 2/1981 | Taylor et al. | |
| 4,331,948 A | 5/1982 | Malinaric et al. | |
| 4,359,414 A | 11/1982 | Mastrangelo | |
| 4,405,432 A | 9/1983 | Kosowsky | |
| 4,439,809 A | 3/1984 | Weight et al. | |
| 4,506,285 A | 3/1985 | Einzinger | |
| 4,591,411 A | 5/1986 | Reimann | |
| 4,642,160 A | 2/1987 | Burgess | |
| 4,702,860 A | 10/1987 | Kinderov et al. | |
| 4,726,877 A | 2/1988 | Fryd et al. | |
| 4,726,991 A | 2/1988 | Hyatt et al. | |

(Continued)

FOREIGN PATENT DOCUMENTS

CH       663491 A5    12/1987

(Continued)

OTHER PUBLICATIONS

Celzard, A., et al., "Conduction Mechanisms in Some Graphite-polymer Composites: The Effect of a Direct-current Electric Field", Journal of Physics: Condensed Matter, 9 (1997) pp. 2225-2237.

(Continued)

*Primary Examiner*—Kiesha R Bryant
*Assistant Examiner*—Minchul Yang
(74) *Attorney, Agent, or Firm*—Mahamedi Paradice Kreisman LLP (57) ABSTRACT

A voltage switchable dielectric material (VSD) material as part of a light-emitting component, including LEDs and OLEDs.

20 Claims, 6 Drawing Sheets

U.S. PATENT DOCUMENTS

| | | | |
|---|---|---|---|
| 4,799,128 A | 1/1989 | Chen | |
| 4,888,574 A | 12/1989 | Rice et al. | |
| 4,892,776 A | 1/1990 | Rice | |
| 4,918,033 A | 4/1990 | Bartha et al. | |
| 4,928,199 A | 5/1990 | Diaz et al. | |
| 4,935,584 A | 6/1990 | Boggs | |
| 4,977,357 A | 12/1990 | Shrier | |
| 4,992,333 A | 2/1991 | Hyatt | |
| 4,996,945 A | 3/1991 | Dix, Jr. | |
| 5,068,634 A | 11/1991 | Shrier | |
| 5,092,032 A | 3/1992 | Murakami | |
| 5,095,626 A | 3/1992 | Kitamura et al. | |
| 5,099,380 A | 3/1992 | Childers et al. | |
| 5,142,263 A | 8/1992 | Childers et al. | |
| 5,148,355 A | 9/1992 | Lowe et al. | |
| 5,183,698 A | 2/1993 | Stephenson et al. | |
| 5,189,387 A | 2/1993 | Childers et al. | |
| 5,246,388 A | 9/1993 | Collins et al. | |
| 5,248,517 A | 9/1993 | Shrier et al. | |
| 5,252,195 A | 10/1993 | Kobayashi et al. | |
| 5,260,848 A | 11/1993 | Childers | |
| 5,262,754 A | 11/1993 | Collins | |
| 5,278,535 A | 1/1994 | Xu et al. | |
| 5,282,312 A | 2/1994 | DiStefano et al. | |
| 5,294,374 A | 3/1994 | Martinez et al. | |
| 5,295,297 A | 3/1994 | Kitamura et al. | |
| 5,300,208 A | 4/1994 | Angelopoulos et al. | |
| 5,317,801 A | 6/1994 | Tanaka et al. | |
| 5,340,641 A | 8/1994 | Xu | |
| 5,347,258 A | 9/1994 | Howard et al. | |
| 5,354,712 A | 10/1994 | Ho et al. | |
| 5,367,764 A | 11/1994 | DiStefano et al. | |
| 5,378,858 A | 1/1995 | Bruckner et al. | |
| 5,380,679 A | 1/1995 | Kano | |
| 5,393,597 A | 2/1995 | Childers et al. | |
| 5,403,208 A | 4/1995 | Felcman et al. | |
| 5,404,637 A | 4/1995 | Kawakami | |
| 5,413,694 A | 5/1995 | Dixon et al. | |
| 5,416,662 A | 5/1995 | Kurasawa et al. | |
| 5,440,075 A | 8/1995 | Kawakita et al. | |
| 5,444,593 A | 8/1995 | Allina | |
| 5,476,471 A | 12/1995 | Shifrin et al. | |
| 5,481,795 A | 1/1996 | Hatakeyama et al. | |
| 5,483,407 A | 1/1996 | Anastasio et al. | |
| 5,487,218 A | 1/1996 | Bhatt et al. | |
| 5,493,146 A | 2/1996 | Pramanik et al. | |
| 5,501,350 A | 3/1996 | Yoshida et al. | |
| 5,502,889 A | 4/1996 | Casson et al. | |
| 5,510,629 A | 4/1996 | Karpovich et al. | |
| 5,550,400 A | 8/1996 | Takagi et al. | |
| 5,557,136 A | 9/1996 | Gordon et al. | |
| 5,654,564 A | 8/1997 | Mohsen | |
| 5,669,381 A | 9/1997 | Hyatt | |
| 5,685,070 A | 11/1997 | Alpaugh et al. | |
| 5,708,298 A | 1/1998 | Masayuki et al. | |
| 5,714,794 A | 2/1998 | Tsuyama et al. | |
| 5,734,188 A | 3/1998 | Murata et al. | |
| 5,744,759 A | 4/1998 | Ameen et al. | |
| 5,781,395 A | 7/1998 | Hyatt | |
| 5,802,714 A | 9/1998 | Kobayashi et al. | |
| 5,807,509 A | 9/1998 | Shrier et al. | |
| 5,808,351 A | 9/1998 | Nathan et al. | |
| 5,834,160 A | 11/1998 | Ferry et al. | |
| 5,834,824 A | 11/1998 | Shepherd et al. | |
| 5,834,893 A | 11/1998 | Bulovic et al. | |
| 5,848,467 A | 12/1998 | Khandros et al. | |
| 5,856,910 A | 1/1999 | Yurchenko et al. | |
| 5,865,934 A | 2/1999 | Yamamoto et al. | |
| 5,869,869 A | 2/1999 | Hively | |
| 5,874,902 A | 2/1999 | Heinrich et al. | |
| 5,906,042 A | 5/1999 | Lan et al. | |
| 5,910,685 A | 6/1999 | Watanabe et al. | |
| 5,926,951 A | 7/1999 | Khandros et al. | |
| 5,940,683 A | 8/1999 | Holm et al. | |
| 5,946,555 A | 8/1999 | Crumly et al. | |
| 5,955,762 A | 9/1999 | Hivley | |
| 5,956,612 A | 9/1999 | Elliott et al. | |
| 5,962,815 A | 10/1999 | Lan et al. | |
| 5,970,321 A | 10/1999 | Hively | |
| 5,972,192 A | 10/1999 | Dubin et al. | |
| 5,977,489 A | 11/1999 | Crotzer et al. | |
| 6,013,358 A | 1/2000 | Winnett et al. | |
| 6,023,028 A | 2/2000 | Neuhalfen | |
| 6,064,094 A | 5/2000 | Intrater et al. | |
| 6,108,184 A | 8/2000 | Minervini et al. | |
| 6,130,459 A | 10/2000 | Intrater | |
| 6,160,695 A | 12/2000 | Winnett et al. | |
| 6,172,590 B1 | 1/2001 | Shrier et al. | |
| 6,184,280 B1 | 2/2001 | Shituba | |
| 6,191,928 B1 | 2/2001 | Rector et al. | |
| 6,198,392 B1 | 3/2001 | Hahn et al. | |
| 6,211,554 B1 | 4/2001 | Whitney | |
| 6,239,687 B1 | 5/2001 | Shrier et al. | |
| 6,251,513 B1 | 6/2001 | Rector et al. | |
| 6,310,752 B1 | 10/2001 | Shrier et al. | |
| 6,316,734 B1 | 11/2001 | Yang | |
| 6,340,789 B1 | 1/2002 | Petritsch et al. | |
| 6,351,011 B1 | 2/2002 | Whitney et al. | |
| 6,373,719 B1 | 4/2002 | Behling et al. | |
| 6,407,411 B1 | 6/2002 | Wojnarowski et al. | |
| 6,433,394 B1 | 8/2002 | Intrater | |
| 6,448,900 B1* | 9/2002 | Chen | 340/815.45 |
| 6,455,916 B1 | 9/2002 | Robinson | |
| 6,512,458 B1* | 1/2003 | Kobayashi et al. | 340/635 |
| 6,534,422 B1 | 3/2003 | Ichikawa et al. | |
| 6,542,065 B2 | 4/2003 | Shrier et al. | |
| 6,549,114 B2 | 4/2003 | Whitney et al. | |
| 6,570,765 B2 | 5/2003 | Behling et al. | |
| 6,593,597 B2 | 7/2003 | Sheu | |
| 6,628,498 B2 | 9/2003 | Whitney et al. | |
| 6,642,297 B1 | 11/2003 | Hyatt et al. | |
| 6,657,532 B1 | 12/2003 | Shrier et al. | |
| 6,693,508 B2 | 2/2004 | Whitney et al. | |
| 6,741,217 B2 | 5/2004 | Toncich et al. | |
| 6,797,145 B2 | 9/2004 | Kosowsky | |
| 6,882,051 B2 | 4/2005 | Majumdar et al. | |
| 6,911,676 B2 | 6/2005 | Yoo | |
| 6,916,872 B2 | 7/2005 | Yadav et al. | |
| 6,981,319 B2 | 1/2006 | Shrier | |
| 7,034,652 B2 | 4/2006 | Whitney et al. | |
| 7,049,926 B2 | 5/2006 | Shrier et al. | |
| 7,053,468 B2 | 5/2006 | Lee | |
| 7,064,353 B2 | 6/2006 | Bhat | |
| 7,132,697 B2 | 11/2006 | Weimer et al. | |
| 7,132,922 B2 | 11/2006 | Harris et al. | |
| 7,141,184 B2 | 11/2006 | Chacko et al. | |
| 7,173,288 B2 | 2/2007 | Lee et al. | |
| 7,183,891 B2 | 2/2007 | Harris et al. | |
| 7,202,770 B2 | 4/2007 | Harris et al. | |
| 7,205,613 B2 | 4/2007 | Fjelstand et al. | |
| 7,218,492 B2 | 5/2007 | Shrier | |
| 7,320,762 B2 | 1/2008 | Greuter et al. | |
| 7,417,194 B2 | 8/2008 | Shrier | |
| 7,446,030 B2 | 11/2008 | Kosowsky | |
| 7,528,467 B2 | 5/2009 | Lee | |
| 2002/0061363 A1 | 5/2002 | Halas et al. | |
| 2003/0008989 A1 | 1/2003 | Gore et al. | |
| 2003/0010960 A1 | 1/2003 | Greuter et al. | |
| 2003/0079910 A1 | 5/2003 | Kosowsky | |
| 2003/0207978 A1 | 11/2003 | Yadav et al. | |
| 2003/0218851 A1 | 11/2003 | Harris et al. | |
| 2004/0063294 A1 | 4/2004 | Durocher et al. | |
| 2004/0095658 A1 | 5/2004 | Buretea et al. | |
| 2004/0154828 A1 | 8/2004 | Moller et al. | |

| | | | |
|---|---|---|---|
| 2004/0160300 A1 | 8/2004 | Shrier | |
| 2004/0211942 A1 | 10/2004 | Clark et al. | |
| 2005/0026334 A1* | 2/2005 | Knall | 438/128 |
| 2005/0083163 A1 | 4/2005 | Shrier | |
| 2005/0106098 A1 | 5/2005 | Tsang et al. | |
| 2005/0208304 A1 | 9/2005 | Collier et al. | |
| 2005/0218380 A1 | 10/2005 | Gramespacher et al. | |
| 2005/0274455 A1 | 12/2005 | Extrand | |
| 2005/0274956 A1 | 12/2005 | Bhat | |
| 2006/0035081 A1 | 2/2006 | Morita et al. | |
| 2006/0060880 A1 | 3/2006 | Lee et al. | |
| 2006/0152334 A1 | 7/2006 | Maercklein et al. | |
| 2006/0167139 A1 | 7/2006 | Nelson et al. | |
| 2006/0181826 A1 | 8/2006 | Dudnikov, Jr. et al. | |
| 2006/0181827 A1 | 8/2006 | Dudnikov, Jr. et al. | |
| 2006/0199390 A1 | 9/2006 | Dudnikov, Jr. et al. | |
| 2006/0211837 A1 | 9/2006 | Ko et al. | |
| 2006/0291127 A1 | 12/2006 | Kim et al. | |
| 2007/0114640 A1 | 5/2007 | Kosowsky | |
| 2007/0116976 A1 | 5/2007 | Tan et al. | |
| 2007/0139848 A1 | 6/2007 | Harris et al. | |
| 2007/0146941 A1 | 6/2007 | Harris et al. | |
| 2007/0208243 A1 | 9/2007 | Gabriel et al. | |
| 2008/0023675 A1 | 1/2008 | Kosowsky | |
| 2008/0029405 A1 | 2/2008 | Kosowsky | |
| 2008/0032049 A1 | 2/2008 | Kosowsky | |
| 2008/0035370 A1 | 2/2008 | Kosowsky | |
| 2008/0045770 A1 | 2/2008 | Sigmund et al. | |
| 2008/0073114 A1 | 3/2008 | Kosowsky | |
| 2008/0313576 A1 | 12/2008 | Kosowsky | |
| 2009/0212266 A1 | 1/2009 | Kosowsky | |
| 2009/0044970 A1 | 2/2009 | Kosowsky | |
| 2009/0050856 A1 | 2/2009 | Kosowsky | |
| 2009/0220771 A1 | 2/2009 | Kosowsky | |
| 2009/0242855 A1 | 3/2009 | Kosowsky | |
| 2009/0256669 A1 | 10/2009 | Kosowsky | |
| 2010/0047535 A1 | 2/2010 | Kosowsky et al. | |

FOREIGN PATENT DOCUMENTS

| | | |
|---|---|---|
| DE | 3040784 A1 | 5/1982 |
| DE | 10115333 A1 | 1/2002 |
| DE | 102004049053 | 5/2005 |
| DE | 102006047377 | 4/2008 |
| EP | 1003229 A1 | 5/2000 |
| EP | 1 245 586 A2 | 10/2002 |
| EP | 0790758 | 11/2004 |
| EP | 1 580 809 A2 | 9/2005 |
| EP | 1542240 A2 | 6/2006 |
| EP | 1 857 871 A1 | 4/2007 |
| EP | 1 990 834 A2 | 11/2008 |
| JP | 56091464 A | 7/1981 |
| JP | 63 195275 A | 8/1988 |
| JP | 2000 062076 A | 2/2000 |
| WO | WO 88/00526 A1 | 1/1988 |
| WO | WO 89/06589 A2 | 7/1989 |
| WO | WO 96/02922 A2 | 2/1996 |
| WO | WO96/02924 A1 | 2/1996 |
| WO | WO 96/02944 A1 | 2/1996 |
| WO | WO97/26665 A1 | 7/1997 |
| WO | WO98/23018 A1 | 5/1998 |
| WO | WO99/24992 A1 | 5/1999 |
| WO | WO99/49525 A1 | 9/1999 |
| WO | WO 02/103085 A1 | 12/2002 |
| WO | WO 2005/100426 A1 | 10/2005 |
| WO | WO 2006/130366 A2 | 12/2006 |
| WO | WO 2007/062170 A2 | 5/2007 |
| WO | WO 2008/016858 A1 | 2/2008 |
| WO | WO 2008/016859 A1 | 2/2008 |
| WO | WO 2008/024207 A1 | 2/2008 |
| WO | WO 2008/036984 A2 | 3/2008 |
| WO | WO 2008/153584 A1 | 12/2008 |
| WO | WO 2009/026299 A1 | 2/2009 |

OTHER PUBLICATIONS

Facchetti, Antonio, "Semiconductors for Organic Transistors", Materials Today, vol. 10, No. 3, pp. 28-37.
International Search Report and Written Opinion of the International Searching Authority in International Application PCT/US06/45291, United States Patent Office, Mar. 5, 2008, 14 pages.
International Search Report and Written Opinion of the International Searching Authority in International Application PCT/US06/45292, United States Patent Office, Feb. 14, 2008, 10 pages.
International Search Report and Written Opinion of the International Searching Authority in International Application PCT/US2007/079377, European Patent Office, Mar. 7, 2008, 13 pages.
International Search Report and Written Opinion of the International Searching Authority in International Application PCT/US2007/074677, European Patent Office, Dec. 5, 2007, 13 pages.
International Search Report and Written Opinion of the International Searching Authority in International Application PCT/US2007/074677, European Patent Office, Dec. 5, 2007, 13 pages.
Modine, F.A. and Hyatt, H.M. "New Varistor Material", Journal of Applied Physics, 64 (8), Oct. 15, 1988, pp. 4229-4232.
Reese, Colin and Bao, Zhenan, "Organic Single-Crystal Field-Effect Transistors", Materials Today, vol. 10, No. 3, pp. 20-27.
U.S. Appl. No. 12/356,490, filed Jan. 20, 2009, Kosowsky.
U.S. Appl. No. 12/370,589, filed Feb. 12, 2009, Kosowsky.
U.S. Appl. No. 12/407,346, filed Mar. 19, 2009, Kosowsky.
Breton et al., "Mechanical properties of multiwall carbon nanotubes/epoxy composites: influence of network morphology," Carbon Elsevier UK, vol. 42, No. 5-6, pp. 1027-1030 (2004).
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
International Preliminary Report on Patentability for International Application PCT/US06/045291, ISA/US, mailed Mar. 24, 2009, 8 pages.
International Preliminary Report on Patentability in International Application PCT/US2007/074677, Feb. 3, 2009, 8 pages.
International Search Report and Written Opinion of the International Searching Authority in International Application PCT/US09/040384, European Patent Office, Jul. 2, 2009, 15 pages.
International Search Report and Written Opinion of the International Searching Authority in International Application PCT/US2008/073603, US Patent Office, Nov. 17, 2008, 7 pages.
International Search Report and Written Opinion in International Application PCT/US2007/079345, mailed Nov. 7, 2008, 25 pages.
International Search Report and Written Opinion in International Application PCT/US2009/038429 mailed Aug. 18, 2009, 20 pgs.
Onoda et al., "Photoinduced Charge Transfer of Conducting Polymer Compositions," IEICE Trans. Electronics, vol. E81-C(7), pp. 1051-1056 (1998).
Raffaelle et al., "Nanomaterial Development for Polymeric Solar Cells," IEEE 4th World Conf on Photovoltaic energy Conversion, pp. 186-189 (2006).
Saunders et al., "Nanoparticle-polymer photovoltaic cells," Adv. Colloid Int. Sci., vol. 138, No. 1, pp. 1-23 (2007).
Communication of Nov. 23, 2009 with Supp European Search Report and Opinion, European Application No. 06 838 319.9 7 pages.
Levinson et al., "The Physics of metal oxide varistors," J. Applied Physics, 46(3): 1332-1341 (1975).
U.S. Appl. No. 11/562,222, Kosowsky, filed Nov. 21, 2006.
U.S. Appl. No. 11/903,820, Kosowsky et al., filed Sep. 24, 2007.
U.S. Appl. No. 12/561,195, Kosowsky et al., filed Sep. 16, 2009.
U.S. Appl. No. 12/571,318, Kosowsky et al., filed Sep. 30, 2009.
U.S. Appl. No. 12/607,952, Fleming et al., filed Oct. 28, 2009.
U.S. Appl. No. 12/638,360, Fleming et al., filed Dec. 15, 2009.
U.S. Appl. No. 12/638,632, Fleming et al., filed Dec. 15, 2009.
U.S. Appl. No. 12/642,799, Fleming et al., filed Dec. 19, 2009.
U.S. Appl. No. 12/692,573, Fleming et al., filed Jan. 22, 2010.
U.S. Appl. No. 12/703,674, Kosowsky et al., filed Feb. 10, 2010.
U.S. Appl. No. 12/703,701, Kosowsky et al., filed Feb. 10, 2010.

U.S. Appl. No. 12/703,723, Kosowsky et al., filed Feb. 10, 2010.
U.S. Appl. No. 12/714,354, Fleming et al., filed Feb. 26, 2010.
U.S. Appl. No. 12/714,358, Fleming et al., filed Feb. 26, 2010.
U.S. Appl. No. 12/717,102, Kosowsky et al., filed Mar. 3, 2010.
Communication of Nov. 11, 2009 with Examination Report in European Patent Application No. 07 813 509.2 5 pages.
Communication pf Nov. 9, 2009 with Examination Report in European Patent Application No. 07 813 508.4, 5 pages.
Communication with Examination Report mailed Dec. 23, 2009 in European app. 06838276.1-2203, 6 pgs.
International Preliminary Report on Patentability for International Application PCT/US07/079377 mailed Dec. 30, 2009, 8 pages.
International Search Report and Written Opinion mailed Nov. 17, 2009 in International Application PCT/US2009/057209, 14 pages.
International Search Report and Written Opinion mailed Nov. 12, 2009 in International Application PCT/US2009/054062, 15 pages.
Reese, Colin and Bao, Zhenan, "Organic Single-Crystal Field-Effect Transistors", Materials Today, vol. 10, No. 3, pp. 20-27, Mar. 2009.
U.S. Appl. No. 12/731,557, Kosowsky, filed Mar. 25, 2010.
Fullerene Chemistry—Wikipedia, http://en.wikipedia.org/wiki/Fullerene/chemistry, 6 pages, printed Apr. 8, 2010.
International Preliminary Report on Patentability for International Application PCT/US2008/073603 mailed Mar. 4, 2010, 7 pages.
International Search Report, Written Opinion and Notice of Transmittal of Same mailed Apr. 16, 2010 for International Application PCT/US2009/062844 20 pages.
International Search Report, Written Opinion and Notice of Transmittal of Same mailed Apr. 20, 2010 for International Application PCT/US2009/059134 22 pages.
International Search Report, Written Opinion, and Notice of Transmittal of same mailed Mar. 18, 2010 for International Application PCT/US2010/021889 15 pages.
Non-Final Office Action mailed Apr. 20, 2010 in U.S. Appl. No. 11/829,946, 20 pages.
Non-Final Office Action dated Apr. 13, 2010 in U.S. Appl. No. 12/714,358, 17 pages.
Non-Final Office Action dated Apr. 13, 2010 in U.S. Appl. No. 12/714,354, 17 pages.
U.S. Appl. No. 12/820,897, Kosowsky, filed Jun. 22, 2010.
U.S. Appl. No. 12/820,939, Kosowsky, filed Jun. 22, 2010.
U.S. Appl. No. 12/820,956, Kosowsky, filed Jun. 22, 2010.
U.S. Appl. No. 12/832,022, Kosowsky, filed Jul. 7, 2010.
U.S. Appl. No. 12/832,033, Kosowsky, filed Jul. 7, 2010.
U.S. Appl. No. 12/832,040, Kosowsky et al., filed Jul. 7, 2010.
U.S. Appl. No. 12/834,273, Kosowsy et al., filed Jul. 12, 2010.
U.S. Appl. No. 12/834,296, Kosowsky et al., filed Jul. 12, 2010.
Examination Report for European Application 06838319.9 mailed May 7, 2010.
Extended European Search Report for European Application 10158080.1.
Notice of Allowance mailed Jun. 21, 2010 in U.S. Appl. No. 11/860,530.
Translation of Office Action of Jul. 7, 2010 in Chinese Application 200680043524.2.

* cited by examiner

LIGHT-EMITTING DEVICE USING VOLTAGE SWITCHABLE DIELECTRIC MATERIAL

RELATED APPLICATIONS

This application claims priority to provisional U.S. patent application Ser No. 60/740,961, filed Nov. 30, 2005, entitled "Light Emitting Devices With ESD Characteristics," the aforementioned application being hereby incorporated by reference in its entirety.

This application also claims priority to provisional U.S. patent application Ser No. 60/739,725, filed Nov. 22, 2005, entitled "RFID Tag Using Voltage Switchable Dielectric Material," the aforementioned application being hereby incorporated by reference in its entirety.

TECHNICAL FIELD

The disclosed embodiments relate generally to the field of light-emitting devices. More specifically, embodiments described herein include a light-emitting device that integrates or incorporates voltage switchable dielectric material.

BACKGROUND

Traditional lighting mechanisms, such as incandescent light-bulbs, are being replaced with more efficient and powerful lighting mechanisms, such as LEDs and OLEDs. While newer lighting mechanisms offer many advantages, they are also more expensive, difficult to make, and often incorporate use of exotic materials. Furthermore, while such new devices may have relatively longer life-spans than more traditional lighting mechanisms, LEDs and OLEDs can fail when exposed to transient electrical conditions. In particular, both organic and inorganic light emitting devices, including the semiconductor chips and polymers used in these devices, are highly susceptible to Electrostatic Discharge (ESD) and other voltage transients such as electrical over-stress (EOS) and electromagnetic pulses (EMP). These devises are historically protected with zener diodes or discrete solid state or polymer surge suppressors.

DETAILED DESCRIPTION

Embodiments described herein provide for the use of a voltage switchable dielectric material (VSD) material as part of a light-emitting component, including LEDs and OLEDs. VSD material may be provided as part of the packaging, or integrated or combined with electrical components and elements of such light-emitting device. As provided with one or more embodiments, the integration of VSD material protects the light-emitting device from voltage transients such as electrostatic discharge (ESD) and electrical overstress (EOS), as well as moisture, impact and other electrical or mechanical threats.

Embodiments also include an apparatus design and technique for safeguarding lighting mechanisms (including LEDs and OLEDs) against ESD events. In particular, one or more embodiments provide for use of VSD material to shield an LED or OLED against ESD events.

Examples of light-emitting devices that are applicable to embodiments described herein include LEDs, OLEDs, or even lighting mechanisms that burn filaments.

As used herein, "voltage switchable material" or "VSD material" is any composition, or combination of compositions, that has a characteristic of being dielectric or non-conductive, unless a voltage is applied to the material that exceeds a characteristic voltage level of the material, in which case the material becomes conductive. Thus, VSD material is a dielectric unless voltage exceeding the characteristic level (e.g. such as provided by ESD events) is applied to the material, in which case the VSD material is conductive. VSD material can also be characterized as any material that can be characterized as a nonlinear resistance material.

Various kinds of VSDM exist. Examples of voltage switchable dielectric materials are provided in references such as U.S. Pat. Nos. 4,977,357, 5,068,634, 5,099,380, 5,142,263, 5,189,387, 5,248,517, 5,807,509, WO 96/02924, and WO 97/26665. In one implementation, the VSDM material may correspond to material manufactured under the trade name of "SURGX".

One or more embodiments provide for use of VSD material that includes 30 to 80% insulator, 0.1% to 70% conductor, and 0% to 70% semiconductor. Examples of insulative materials include but not limited to silicone polymers, epoxy, polyimide, polyethylene, polypropylene, polyphenylene oxide, polysulphone, solgel materials, creamers, silicone dioxide, aluminum oxide, zirconia oxide, and other metal oxide insulators. Examples of conductive materials include metals such as copper, aluminum, nickel, and stainless steel. Examples of semiconductive material include both organic and inorganic semiconductors. Some inorganic semiconductors include silicon, silicon carbide, boron nitride, aluminum nitride, nickel oxide, zinc oxide, and zinc sulfide. Examples of organic semiconductors include poly-3-hexylthiophene, pentacene, perylene, carbon nanotubes, and C60 fullerenes. The specific formulation and composition may be selected for mechanical and electrical properties that best suit the particular application of the VSD material.

Additionally, one or more embodiments incorporate VSD material onto an underlying substrate or board on which a light-emitting device is provided. The VSD material may also be applied onto a substrate that is subsequently used to form some or all of the remaining device. Ion deposition processes, such as electroplating, may be used to form conductive elements on the substrate while the VSD material is in a conductive state. The positioning and configuration of the conductive elements may be selective to accommodate the electrical leads, terminals (i.e. input or outputs) and other conductive elements that are provided with, used by or incorporated into the light-emitting device.

Still further, one or more embodiments provide that VSD material is integrated or incorporated into the housing, intermediate layer or provided in some other formation that is integral or connected to a light-emitting device.

Additionally, one or more embodiments provide that VSD material is used during electroplating or other ion deposition processes for forming conductive elements and components of a light emitting device on a substrate or other structure. In one embodiment, a substrate is formed to include a layer of VSD material. A layer of resistive material is provided over the layer of VSD material. The resistive material is selectively removed to form a pattern that exposes regions of the resistive layer that identify locations that are to underlie where conductive elements of the light-emitting device are to be formed. In one embodiment, may correspond to any one or more of the following: (i) the leads and/or terminals into and out of the lighting component, electrical interconnect between the lighting component and other elements on the substrate, or between elements of the lighting component, (ii) the semiconductor or other light-emitting component of the device. Once the pattern is formed, a voltage is applied to the substrate that exceeds the characteristic voltage of the VSD material. Concurrently with applying the voltage, the substrate is exposed to ionic deposition so that conductive material bonds to the VSD material. This results in the formation of conductive traces on the substrate where at least a portion of the pattern is provided.

Various embodiments described herein apply VSD material to LED and OLED devices to enable a robust, scalable technique to manufacture and/or configure LED/OLED devices to have inherent ESD protection. With respect to high-brightness LEDs, for example, conventional approaches have long suffered from inability to handle ESD events, at least without implementing solutions that are expensive and/or affect scalability. In contrast, embodiments described herein enable scalable implementation of VSD material into LED and OLED devices, so as to provide inherent protection against ESD events. Furthermore, as described with embodiments of FIGS. 7 and 8A-FIG. 8E, the VSD material may be incorporated into LED devices and substrates to improve and facilitate the manufacturing of such devices, while at the same time providing inherent ESD protection.

OVERVIEW

Figure 1:
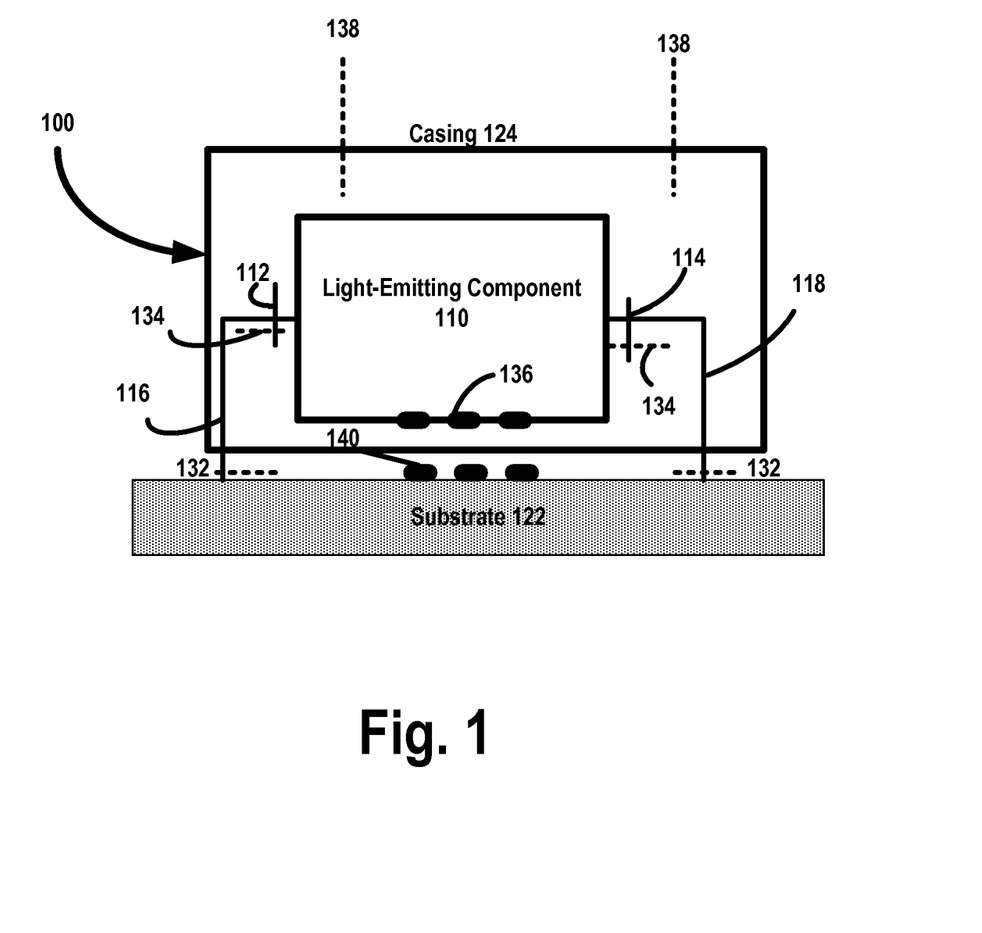
FIG. 1 is a block diagram of a light-emitting device, configured to incorporate or integrate VSD material, according to embodiments of the invention.

FIG. 1 is a block diagram of a light-emitting device, configured to incorporate or integrate VSD material, according to embodiments of the invention. A device 100 includes a light-emitting component 110 that carries current from an inlet terminal 112 to an outlet terminal 114. The current passing through component 110 results in the generation of light. The component 110 may be comprised of different materials and/or structures. For example, in the case of an LED, the component 110 may be formed from any one of many possible semiconductor materials. An OLED, on the other hand, may be formed from organic materials, including polymers. The light-emitting component 110 may include other kinds of components as well. For example, one or more embodiments described herein may be implemented on a filament formed from exotic material that "burns" to emit light in a particular spectrum, when current is passed through.

Depending on, for example, the type of materials used and/or the structure of the component 110, the spectrum of the emitted light may vary. In the case where the light-emitting component corresponds to an LED, the emitted light may include light from the visible spectrum (e.g. white, blue, green, red, yellow), or from the invisible spectrum (e.g. infra-red, near-ultraviolet).

Regardless of the type of material and structure used for lighting component 110, embodiments described herein enable the device as a whole to better sustain transient electrical voltages and events as a result of the inclusion of VSD material.

In order to form the device 100, the light-emitting component 110 may be provided in one of alternative operational environments. In one implementation, light-emitting component 110 is provided on an optional substrate 122 or other platform, with conductive traces or elements interconnecting the device 100 to other devices provided with or mounted to the substrate. As an alternative or additional feature, one or more implementations provide that the light-emitting component 110 is included within a casing 124. Structures (including members or the substrate 122) may affix the light-emitting component 110 to the casing 124, and the casing 124 may be translucent or include translucent sections. As still another variation, the light-emitting component 110 may be provided as a standalone structure. For example, as described with an embodiment of FIG. 3, the light-emitting device 100 may be in the form of an LED, and include leads that extend from inlet/outlet terminals 112, 114 of the LED to enable the LED to be surface mounted to a substrate. Alternatively, the light emitting component 110 may be provided as part of a substrate and may include other components.

With regard to an embodiment of FIG. 1, positions 132-140 represent possible locations where VSD material can be integrated into the device 100. Since positions 132-140 are representative of other like positions or regions on the device, discussion of VSD material at any given individual position 132-140 is applicable to a class of locations represented by that one positions. According to one embodiment, VSD material may be provided with the device 100 at locations represented by position 132. At such locations, VSD material may be combined or integrated with conductive channels 116, 118 (e.g. traces, lead frames) that extend into the terminals 112, 114. In another embodiment, VSD material may be combined or integrated with one or both of the terminals 112, 114, as represented by position 134. As an alternative or additional variation, VSD material may be provided with the device 100 at locations represented by positions 136. At such locations, the VSD material may be combined or integrated with (or within) the light-emitting component 110.

As an alternative or addition to embodiments in which the VSD material is integrated or combined with electrical elements and components, one or more embodiments provide that the VSD material is integrated or combined into mechanical components or aspects of the device 100. Position 138 represents the inclusion of VSD material applied on or as part of the casing 124 of the device 100. In one implementation, the composition of the VSD material may include favorable mechanical characteristics (e.g. rigidity, flexure) for its use in the casing 124. Thus, for example, the VSD material may form part of a shell that encapsulates the light-emitting component 110. Alternatively, the VSD material may be included in structures that affix the device 100 to the casing 124.

As an alternative or addition to use of casing 124, the device 100 may be mounted onto the substrate 122. In one implementation, substrate 122 may incorporate the device as part of a much larger system, such as on a printed circuit board or motherboard. Alternatively, the substrate 122 may be relatively small, such as the size to isolate a singe device 100, or an array of like devices 100. Position 140 represents use of the VSD material in locations that overlay the substrate 122. For example, VSD material may be applied as a layer over the substrate. As described with one or more other embodiments, application of VSD material to a substrate may be part of a fabrication process where electrical elements are formed on the substrate.

As described with embodiments of FIG. 1, the locations where VSD material is provided on the device 100 may vary. Considerations for locations where VSD material is to be provided may be based on factors that include: (i) the desired amount of VSD material that is to be used; (ii) the mechanical characteristics and qualities of the composition used; (iii) ease of assembly in incorporating the VSD material; and (iv) the medium or application for the light-emitting device. For example, as described with embodiments of FIG. 8A-8E, it may be beneficial to use VSD material as part of a plating process to form electrical leads, contacts, vias and other conductive elements of a circuit board. In such context, the locations for terminals 112, 114, or leads 116, 118 may be predetermined and formed on the circuit board using a process that relies on VSD material. As a result of such processes, the VSD material may be integrated with the terminals 112, 114, or leads 116, 118. For example, the VSD material may underlie conductive traces that correspond to either of the terminals 112, 114 or leads 116, 118.

Light Emitting Diodes

Light emitting diodes are one kind of light emitting device that can integrate or otherwise incorporate VSD material, according to embodiments described herein. This section illustrates different implementations of light-emitting diodes that integrate or incorporate VSD material, according to embodiments of the invention.

Figure 2:
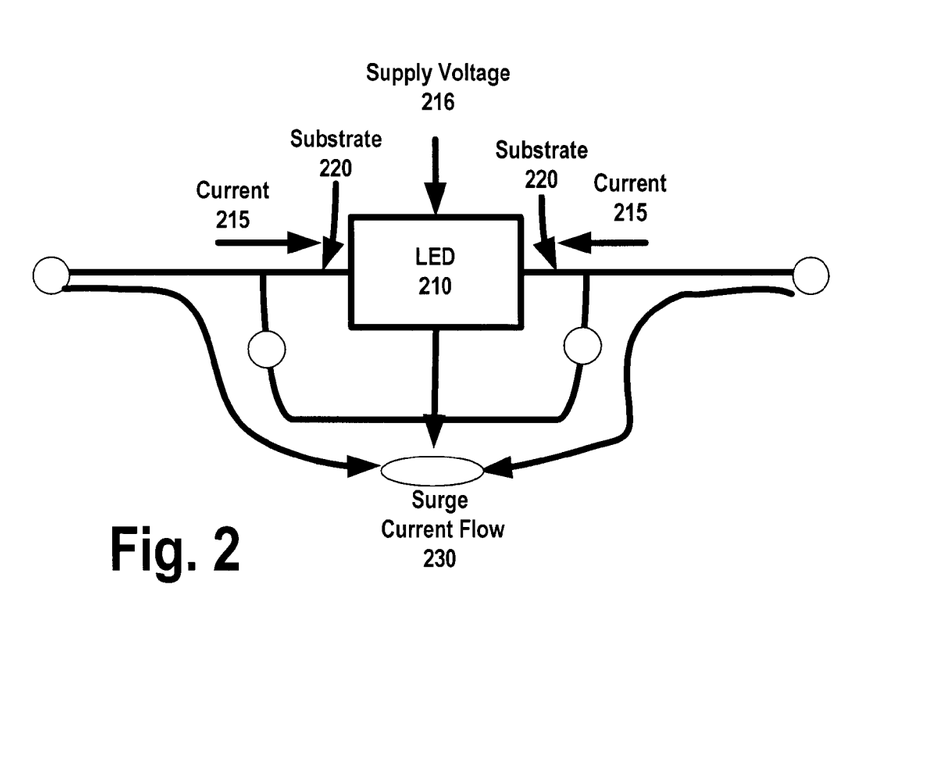
FIG. 2 is a simplified schematic of a light-emitting diode, configured to include VSD material, under an embodiment of the invention.

FIG. 2 is a simplified schematic of a light-emitting diode, configured to include VSD material, under an embodiment of the invention. In an embodiment of FIG. 2, an LED 210 can be provided in any one of multiple environment or configurations. In an embodiment, the LED component 210 may be a self-contained device (e.g. with translucent housing), or alternatively the portion of the device that emits light (e.g. the chip). The LED component 210 may correspond to an integrated circuit chip, formed from semi-conductor material, including doped substrates and layered thicknesses of semiconductor compounds. Specific materials for use in LEDs include silicon, gallium arsenide, gallium phosphide, aluminum gallium arsenide, silicon carbide, sapphire, diamond, zinc selenide, aluminum nitride, and indium gallium nitride.

In an embodiment, LED component 210 is configured to receive, under normal operating conditions, a current 215 ("normal current 215") and supply voltage 116. When activated by the current, the LED component 210 emits light that has wavelength characteristics determined by the composition of the LED component.

In an embodiment, VSD material is provided underneath or as part of a substrate 220 or other structure that supports the LED component 210. For example, LED component 210 may be mounted on a substrate that interconnects multiple elements, including the LED component 210. Under normal conditions, the substrate 220 has dielectric properties, so that the normal current 215 and voltage supply 216 are unimpeded. If, however, a surge (or transient) voltage is generated that exceeds the characteristic voltage level of the VSD material, the VSD material of the substrate switches to being conductive. In the conductive state, the VSD material provides a ground for the resulting current flow. A surge voltage flow 230 results, illustrating the grounding effect of the VSD material in the substrate 220. The surge voltage that causes the voltage flow 230 may be any voltage that is above a characteristic voltage level of the VSD material applied or integrated with substrate 220.

As with any other embodiment, VSD material may be structured through any one or more of quantity, concentration, location, thickness or composition to have a characteristic voltage suitable for the intended use. Thus, for example, the characteristic voltage of the VSD material may be selected to be less than the breakdown voltage of the LED component 210, so that the LED component will not fail in any ESD event.

Figure 3:
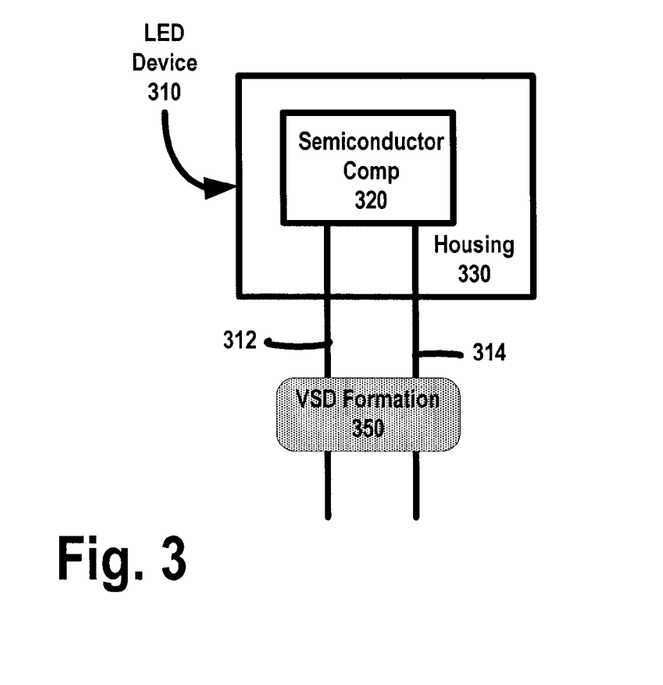
FIG. 3 illustrates an LED device configured to include VSD material, according to one or more embodiments of the invention.

FIG. 3 illustrates an LED device configured to include VSD material, according to one or more embodiments of the invention. In an embodiment, LED device 310 is self-contained so that it can be mounted onto a substrate or other device to illuminate. The LED device 310 includes a semiconductor component 320, a housing 330, and conductive leads 312, 314. The conductive leads 312, 314 provide a negative and positive terminal to enable a current medium through the component 320. In an embodiment, VSD material is provided in a formation 350 that extends between and connects the leads 312.

In one embodiment, the amount of VSD material in the formation 350 is relatively small, so that the formation 350 provides relatively little structural support. In another embodiment, the amount of VSD material in formation 350 includes sufficient mass to provide a base for supporting the leads 312, 314 in an affixed position.

Under normal operations, the formation 350 of VSD material may provide insulation and structure to the leads. In the presence of a transient voltage that exceeds the characteristic voltage level of the VSD composition in use, the formation 350 switches from being dielectric to becoming conductive. In this formation, the formation 350 provides a conductive path between the leads 312, 314. The effect is to ground the LED 310 when the transient voltage occurs.

The formation 350 of VSD material may, based on the composition and/or amount of VSD material in use, include a characteristic voltage level that is less than a breakdown voltage of the LED device 310 as a whole. As such, the presence of the transient voltage is less likely to damage the LED device 310.

Figure 4:
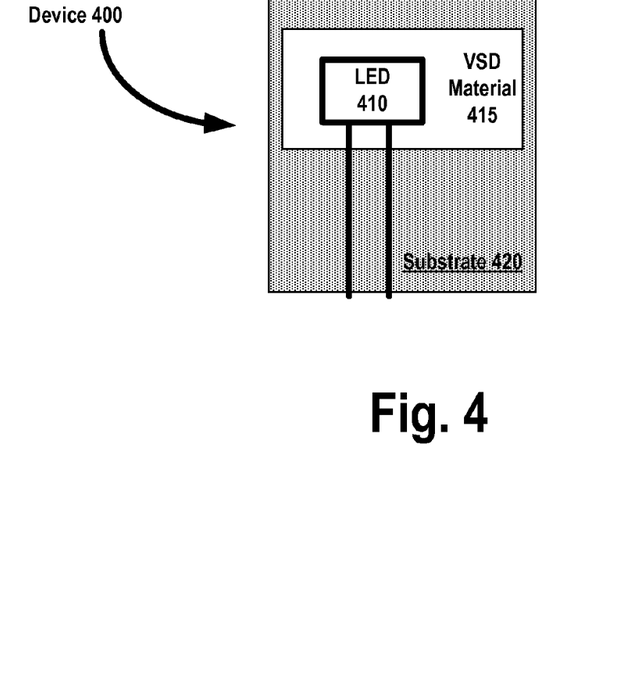
FIG. 4 illustrates an LED device that is mounted to an underlying substrate or platform, with the incorporation of VSD material, according to an embodiment of the invention.

FIG. 4 illustrates an LED device that is mounted to an underlying substrate or platform, with the incorporation of VSD material, according to an embodiment of the invention. In an embodiment, a device 400 includes an LED device 410 that is mounted or otherwise connected to an underlying substrate 420. The LED device 410 includes a semi-conductor component, such as provided by an integrated circuit chip. A layer of VSD material (VSD layer 415) is provided underneath the LED device 410 (e.g. under the chip).

Under normal conditions, the VSD layer 415 is a dielectric and does not affect operations of the LED device 410. When an ESD or other electrical event occurs, the VSD layer 415 directs the current resulting from the event to ground.

In an embodiment, the underlying VSD layer 415 serves the additional role of acting as an adhesive or affixture mechanism between the substrate 420 and the LED device 410. For example, some VSD materials have inherent adhesive properties. In such cases, the VSD layer 415 provides an underlying adhesive layer to the LED device 410.

Figure 5:
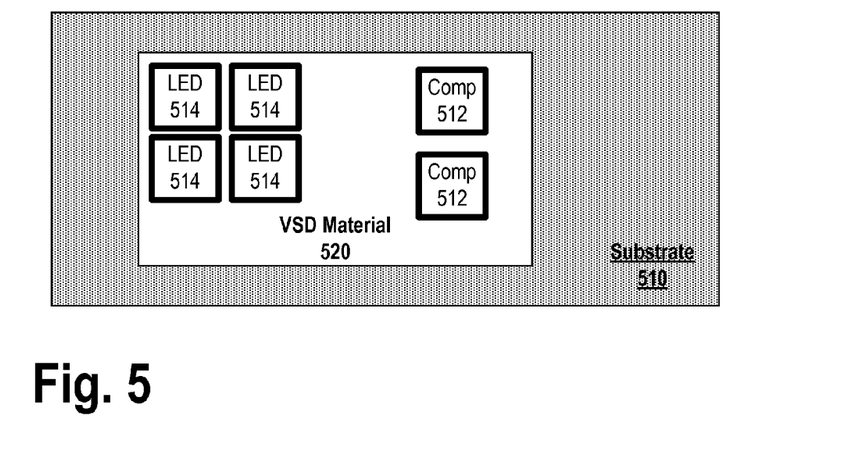
FIG. 5 illustrates another embodiment in which one or more LED devices are mounted to a substrate or other multi-element platform, in which VSD material is included, under an embodiment of the invention.

FIG. 5 illustrates another embodiment in which one or more LED devices are mounted to a substrate or other multi-element platform, in which VSD material is included, under an embodiment of the invention. In an embodiment of FIG. 5, a substrate 510 includes numerous components 512, including one or more LED devices 514. As described with one or more other embodiments, the substrate 510 may have a layer of VSD material ("VSD layer 520"). As described with an embodiment of FIG. 8A-8E, the VSD layer 520 may be applied as a step to forming other electrical elements, including circuit elements and traces, that are integrally combined with the VSD material 520.

Alternatively, the VSD material may be provided independent of the formation of other electrical components on the substrate 510. For example, VSD material may be provided on the substrate independent of the formation of trace elements, but coupled to the LED devices in a manner that enables the VSD material to ground those devices.

OLED Devices with VSD Material

One or more embodiments incorporate or integrate VSD material with OLED devices. According to an embodiment, an OLED device is coupled to VSD material so that the VSD can conduct current away from the OLED device in the presence of transient voltages and other abnormal electrical occurrences that exceed the operation specification of the OLED.

Figure 6:
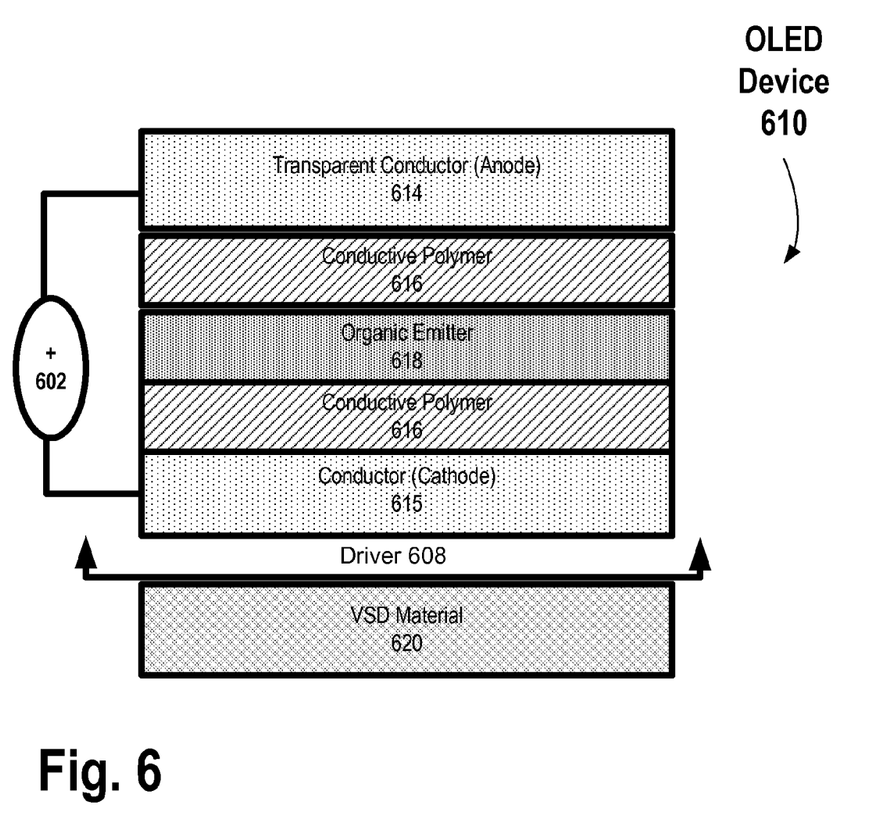
FIG. 6 illustrates an OLED device 610, configured under an embodiment of the invention.

FIG. 6 illustrates an OLED device 610, configured under an embodiment of the invention. The OLED device 610 may include various layers that combine to emit light when current is passed through the device. In one embodiment, the device 610 comprises a stack of thicknesses or layers. In such a stack, a first transparent conductor 614 provides an anode terminal on one end of the stack, and a second conductor 615 provides a cathode terminal on the other end of the stack. The stack includes one or more conductive polymer layers 616, including a conductive polymer layer positioned adjacent to the first conductor 614 (anode), and a second conductive polymer layer positioned adjacent to the second conductor 615 (cathode). An organic emitter 618 may be positioned between layers of organic polymer 616. A driver 608 may be coupled to the stack to enable electronic control and use of the emitter 618, in connection with an applied voltage differential 602. Under a conventional approach, a current resulting from the applied voltage differential 602 causes the organic emitter 618 to emit light.

In an embodiment, a layer of VSD material 620 is connected to the driver 608. The VSD material may provide grounding when current from an unexpected source (e.g. ESD event) is encountered. Rather than being received by the driver 608 or being directed into the stack of the OLED 610, the VSD becomes conductive, and grounds the OLED device 610 against the surge. The VSD material may be structured, designed or selected to have a characteristic voltage level (where it switches to being conductive) that is less than the breakdown voltage of the OLED device 610, so that the VSD becomes conductive and grounds the device before it can breakdown or become non-operational.

Device Formation with VSD Material

Figure 7:
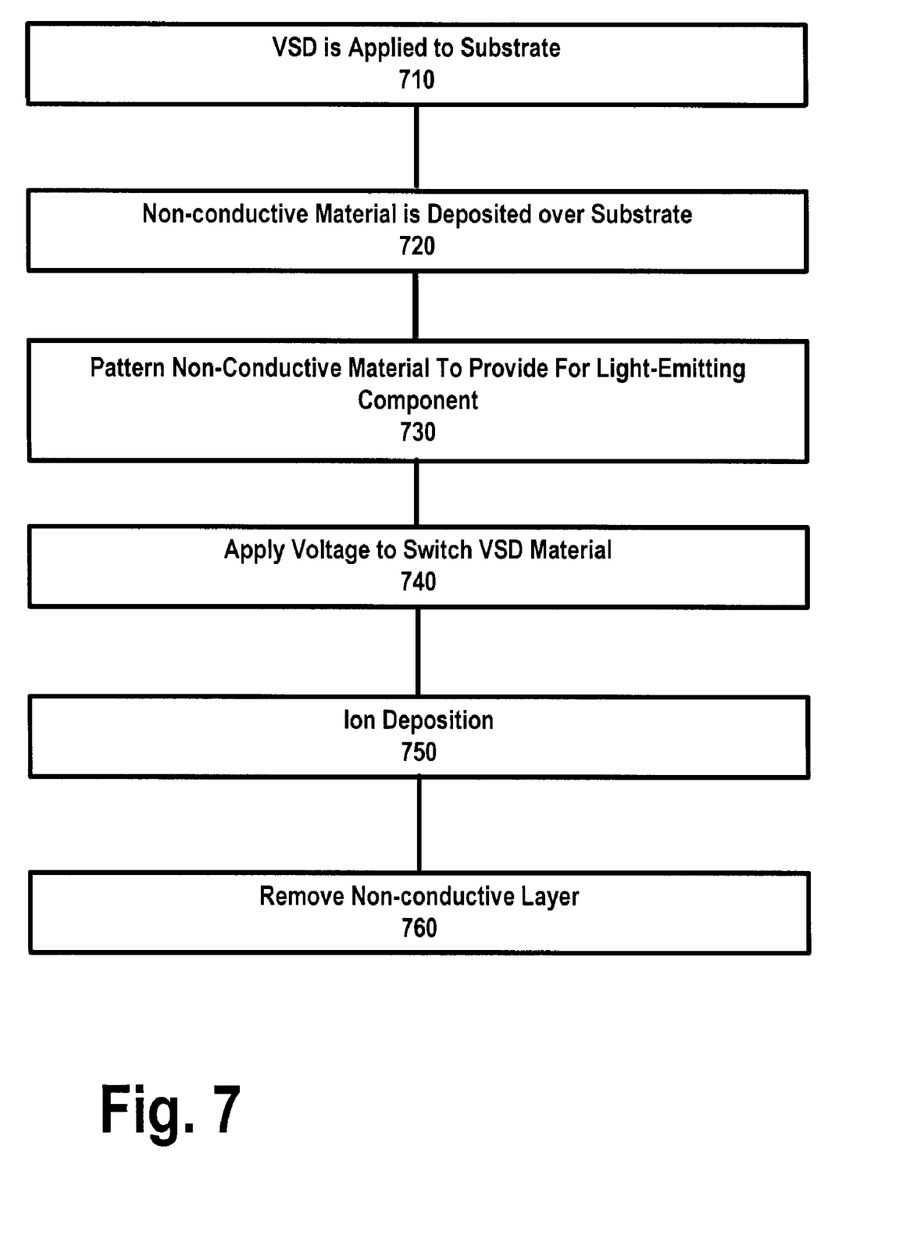
FIG. 7 illustrates a technique for forming a light-emitting device that integrates VSD material, under an embodiment of the invention.

FIG. 7 illustrates a technique for forming a light-emitting device that integrates VSD material, under an embodiment of the invention. A method such as described by FIG. 7 may be used to form devices such as LEDs or other light-emitting components, including those that can be mounted onto a board or substrate to have interconnectivity with other components.

General techniques for electroplating or forming electrical circuits and components using VSD material are described in the following: U.S. patent application Ser. No. 10/941,226, filed Sep. 14, 2004, entitled "Current Carrying Structure Using Voltage Switchable Dielectric Material," naming Lex Kosowsky as sole inventor; which is a continuation of U.S. Pat. No. 6,797,145 (formerly U.S. patent application Ser. No. 10/315,496), filed on Dec. 9, 2002 and entitled "Current Carrying Structure Using Voltage Switchable Dielectric Material," naming Lex Kosowsky as sole inventor; which is a continuation of U.S. patent application Ser. No. 09/437,882, filed on Nov. 10, 1999 and now abandoned; which claims priority to Provisional U.S. Application No. 60/151,188, filed on Aug. 27, 1999, and now expired. All of the aforementioned applications are hereby incorporated by reference in their respective entirety for all purposes.

According to a step 710, VSD material is applied to a substrate or surface on which conductive components and elements are to be provided. The amount of VSD material that may be deposited on the substrate may, depending on the application of the process described, range from between 1 micron to 1000 microns in thickness.

In a step 720, a layer of non-conductive material is provided over the VSD material. For example, photoresist material may be deposited over the VSD material.

Step 730 provides that the non-conductive layer is patterned on the substrate. The patterning exposes regions which coincide in position with the subsequent formation of conductive elements that are to comprise portions of an electrical component that is to include the light-emitting component. For example, the patterning may be selective to designate exposed regions that are to coincide with formation of electrical leads or terminals for the lighting component. In one embodiment, a mask may be applied to the non-conductive layer in order to pattern it.

For light-emitting devices such as described with one or more other embodiments, the exposed regions may coincide with locations where traces for leads, terminals, or interconnectivity elements to and from the light-emitting device are to be provided. However, as described with an embodiment of FIG. 3, for example, VSD material may extend between leads of the lighting-component. Accordingly, the patterning process may also expose VSD material for subsequent use without additional conductive material or traces. Thus, the patterning may expose regions where VSD material is to be exposed.

In step 740, the VSD material is triggered or switched from being dielectric to being conductive. The VSD material may be applied a voltage that exceeds the material's characteristic voltage level. This voltage may be applied either on the thickness that includes the VSD material, or in the portion of the substrate that is underneath the VSD material. In the latter case, the portion of the substrate underneath the VSD material may be conductive (e.g. formed from copper or other metals) so as to carry the charge to the VSD material. Application of the voltage to the conductive substrate may be desired in come cases to avoid linear conductivity by the VSD material in the direction of the substrate. The applied voltage may be steady (e.g. "DC") or pulsed.

While the VSD material is conductive, step 750 provides that an ion deposition process is performed to form conductive elements (e.g. traces) within the exposed regions of the pattern. Anyone of many processes may be performed to deposit ionic media into at least some of the exposed regions defined by the pattern of the non-conductive layer. In one implementation, an electroplating process is performed, where the substrate, with the VSD material and patterned photoresist material, is submerged into an electrolytic solution.

As alternative implementation, ionic deposition is performed using a powder coating process. In this process, power particles are charged and applied to the exposed regions defined by the pattern. The application of the powder may be accomplished by depositing the powder on the exposed regions, or by submerging the substrate in a powder bath.

Still further, another implementation may use an electro-spray process. Ionic media may be contained in the form of charged particles in a solution. The solution may be applied to the substrate while the VSD material is conductive. The application of the spray may include the use of ink or paint.

Other deposition techniques may also be used for performing ion deposition on the VSD material when in the conductive state, For example, vacuum deposition processes such as physical vapor deposition (PVD) or chemical vapor deposition (CVD) processes. In PVD, metal ions are introduced into a chamber to combine with gas ions. The VSD material on the substrate may be made conductive to have an opposite charge, so as to attract and bond with the ions of the chamber. In CVD, a film of ionic material may be applied to the VSD material on the surface of the substrate.

In step 760, the non-conductive material is optionally removed from the substrate, so as to leave the formed conductive elements. In one implementation, a base solution (e.g. KOH), or water, is applied to the substrate to remove the photoresist material, The conductive elements may correspond to leads, traces and other elements that are positioned to interconnect various components and/or regions of the substrate with each other and/or to the light-emitting device.

Subsequent to removing the photoresist layer, one or more embodiments provide that a polishing step is performed on the substrate with the formed electrical elements. In one embodiment, a chemical mechanical polish is used to polish the substrate.

The resulting substrate includes electrical elements with inherent ability to handle transient voltages and EOS. In the context of a light-emitting devices, and substrates and other devices that include light-emitting devices, a process such as described in FIG. 7 may be used to form trace elements that include the terminals and leads of the light-emitting device, as well as other electrical elements and the interconnect elements with other components on the substrate. In one implementation, for example, the substrate is formed, devices such as micro-chips, memory components and other devices may be mounted onto the board in predetermined positions that coincide with the pattern of conductive components and elements.

FIG. 8A-FIG. 8E illustrate a process for forming an LED device, according to one or more embodiments of the invention. A process such as described with FIG. 8A-FIG. 8E may be performed in order to integrally form VSD material with electrical components and elements of the LED device, or the substrate that carries the LED ("LED substrate"). The LED substrate may be dedicated for a single LED device, an array of LED devices, or an LED with a combination of other electrical components and elements. In the latter case, for example, the LED may provide a status light indicator for components on a circuit board. FIG. 8A-8E illustrates an implementation in which a light-emitting component 855 is combined with various other components or interconnect elements, under an embodiment of the invention.

Among other advantages, use of VSD material simplifies the process for forming such a device, while at the same time, enabling electrical components or elements of the LED or LED substrate to have inherent ability to handle EOS or ESD events. In particular, the integration of VSD material into the electrical components of the LED substrate enables the VSD material to ground the device when transient voltages are present (such as when ESD events occur).

Figure 8A:
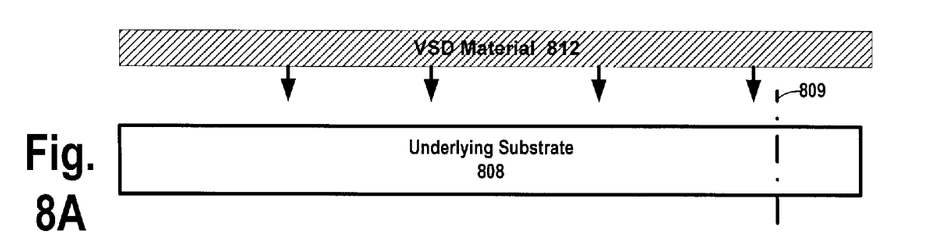
FIG. 8A-FIG. 8E illustrate a process for forming an LED device, according to one or more embodiments of the invention.

In a step illustrated by FIG. 8A, a substrate 810 is formed to include VSD material 812. Under one implementation, the VSD material 812 is deposited as a layer over an underlying substrate 808.

Figures 8B, 8C:
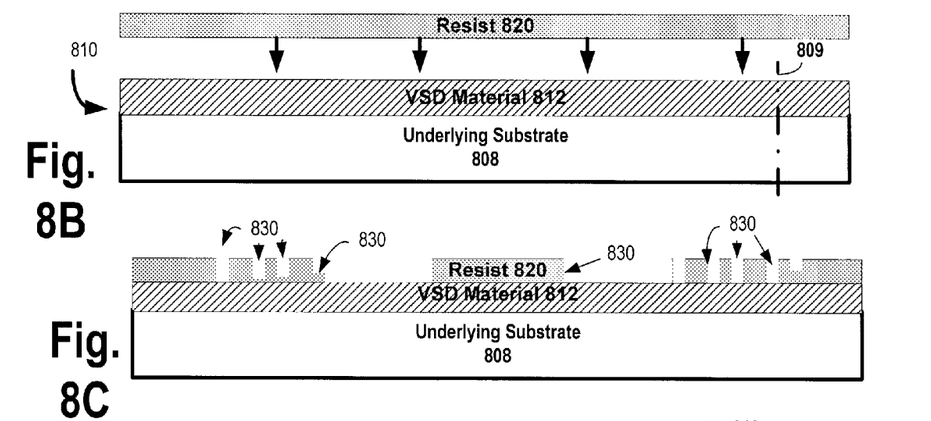

Subsequently, FIG. 8B illustrates a step in which a non-conductive layer 820 is deposited on the substrate 810. The non-conductive layer 820 may correspond to, for example, photoresist material.

In a step illustrated by FIG. 8C, the non-conductive layer is patterned to form exposed regions 830. A resulting pattern corresponds to the pattern of conductive elements and components that are to be provided on the LED substrate as a result of the formation process being described.

Figure 8D:
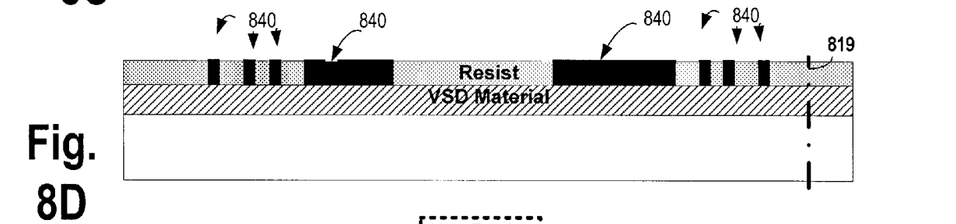

In a step described by FIG. 8D, conductive elements 840 are formed over the exposed regions 840 defined by the pattern formed in a step of FIG. 8C. Under an embodiment, a voltage is applied to the substrate 810 that exceeds the characteristic voltage of the VSD material 812. Application of the voltage results in the VSD material 812 switching from being dielectric to being conductive. Once the VSD material 812 is made conductive with application of the voltage, ionic media is deposited in the exposed regions defined by the pattern to form the electrical elements and components.

In one implementation, ionic media deposition is performed by way of an electroplating process. In the electroplating process, the substrate 810 is submerged in an electrolytic solution, where ionic media from the solution bonds with the VSD material (which is in a conductive state) in the exposed regions defined by the pattern. As a result of this step, conductive material 840 is formed on the substrate 810, and the VSD material 812 underlies the conductive elements or components that will result from the formation of the conductive material 840.

As described with an embodiment of FIG. 7, the underlying substrate 808 may be formed from conductive material, such as a metal. Application of the voltage may occur at a point of contact that coincides with the substrate 808, and not directly with the VSD material 812. For example, the voltage may be provided underneath the substrate 808. Such application of voltage may be implemented to avoid, for example, linear (i.e. horizontal) conductivity on the VSD material.

As also described, the application of the voltage may be steady or pulsed.

Alternative ionic media deposition processes may be performed. For example, as described with an embodiment of FIG. 7, a powder coating process may be used to deposit charged powder particles into the exposed regions defined by the pattern. Alternatively, an electro-spray may force ionic media in a solution to bond and form electrical material in the exposed regions defined by the pattern. Still further, other techniques, including any of the vacuum deposition techniques described with an embodiment of FIG. 7 may be used.

Figure 8E:
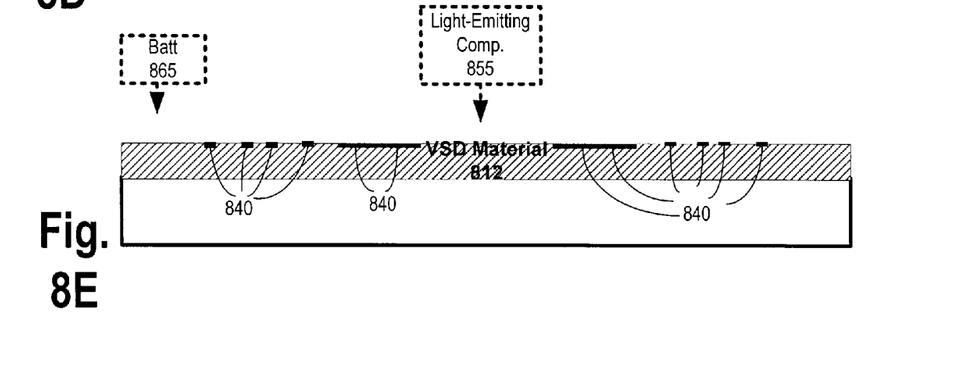

In a step of FIG. 8E, the non-conductive layer 820 is removed and the conductive elements 840 or polished or are otherwise reduced on the substrate to form some or all of the trace, leads and components of the LED substrate. The removal of the non-conductive layer 820 may be omitted in some applications where it is desirable to maintain a layer of such material.

FIG. 8E illustrates how components and elements of an LED substrate may be formed as a result of a process described. In an embodiment, the VSD material 812 is integrated with and underlies trace elements that, for example, (i) the positive and negative terminals of a light-emitting component 855, (ii) leads to and from the terminals, (iii) interconnect to other components and elements of the LED substrate. One or more embodiments may also provide that VSD material 812 underlies trace elements that underlie, for example, a substrate power mechanism 865 (e.g. a battery, or a lead to a battery or power receiver), or trace elements that interconnect the LED to other components are to power.

An embodiment such as described by FIG. 8A-8E enables creation of electrical components and elements within the LED substrate that overlay VSD material. In this manner, the LED substrate includes inherent capabilities to ground transient voltages that may result from, for example, ESD or EOS. Furthermore, the LED substrate may be created using fewer fabrication steps, as compared to more conventional techniques.

One or more embodiments provide for LED substrate to include an array of LED components that are designed to be separated from the substrate and used individually, or in combination with other LEDs.

While embodiments such as described with FIG. 8A-8E and elsewhere in this application describe use of VSD material, one or more embodiments provide that different compositions and formulations of VSD material for use on a single LED substrate. For example, the application of VSD material 812 onto a substrate (FIG. 8A) may include application of multiple VSD material, each with a different composition. This allows the design of the LED or LED substrate to utilize VSD materials with mechanical or electrical characteristics that are best suited for a particular electrical component or element.

While FIG. 8A-FIG. 8E are specific to the creation of an LED or LED substrate, other lighting components such as described with other embodiments of this application may be created or formed in part through processes such as described herein.

Moreover, with regard to any of the embodiments described, the LED substrate may be multi-dimensional. For example, components for an LED substrate may be incorporated on both sides of a substrate, and then conductively interconnected through use of one or more vias. The creation of a conductive vias may be performed in any one of many conventional techniques. Alternatively, one or more embodiments provide for formation of a vias on a substrate such as shown in embodiments of FIG. 8A-8E as follows: (i) drill or form a hole 809 that extends through the substrate 808 (FIG. 8A); (ii) when applying VSD material, extend VSD material into the vias 809; (iii) when patterning the photoresist, form the pattern so that a path is formed for conductive trace elements to extend to a boundary of the hole 809; (iv) perform ionic deposition so that the vias is surfaced with conductive material, forming conductive or operational vias 819; and (v) repeat the process described to accommodate electrical elements and components on the opposing side of the substrate. A process for forming plated vias 419 using VSD material is described in more detail with U.S. Pat. No. 6,797,145, which is incorporated by reference in its entirety by this application.

In addition to two sided substrates, vias may extend conductivity to multiple conductive layers for a suitable designed substrate. For example, some substrates include intermediate thickness layers that include electrical components and elements. Vias may extend to connect to such layers embedded in the overall thickness of the substrate. In this way, the LED substrate may include conductively connected LEDs on different planes or surfaces, as well as components or elements that interconnect with the LEDs.

CONCLUSION

Embodiments described with reference to the drawings are considered illustrative, and Applicant's claims should not be limited to details of such illustrative embodiments. Various modifications and variations may be included with embodiments described, including the combination of features described separately with different illustrative embodiments. Accordingly, it is intended that the scope of the invention be defined by the following claims. Furthermore, it is contemplated that a particular feature described either individually or as part of an embodiment can be combined with other individually described features, or parts of other embodiments, even if the other features and embodiments make no mentioned of the particular feature.

What is claimed is:

1. A light-emitting device comprising:
a semiconductor structure having semiconductive organic material, the semiconductor structure providing a component that is structured to emit light by carrying current between at least a first terminal and a second terminal;
an organic polymer composition comprising a combination of conductor and/or semiconductor particles, wherein the polymer composition is structured to have a characteristic of (i) being a dielectric in absence of a voltage that exceeds a characteristic voltage level of the composition, and (ii) with application of the voltage exceeding the characteristic voltage level, switching into a conductor for only a duration in which the voltage is present;
wherein the composition is positioned, relative to the component that emits light, to provide grounding for the component against any transient voltage that exceeds the characteristic voltage level of the composition.

2. The device of claim 1, wherein the component is a diode.

3. The device of claim 1, wherein the component is formed from a semiconductor material.

4. The device of claim 3, wherein the component includes a first lead extending from the first terminal, and a second lead extending from a second terminal, and wherein the composition is positioned between and in contact with the first lead and the second lead.

5. The device of claim 3, wherein the component is provided on a substrate, and wherein the composition is provided with the substrate.

6. The device of claim 5, wherein the material is provided on the substrate to underlie any one or more of (i) the component formed from the semiconductor material, (ii) the first terminal of the component, (iii) the second terminal of the component, (iv) a first lead of the first terminal, or (v) a second lead of the second terminal.

7. The device of claim 1, wherein the component is formed from an organic polymer.

8. The device of claim 1, wherein the composition is provided to contact any one or more of (i) the semiconductor material, (ii) the first terminal of the component, (iii) the second terminal of the component, (iv) a first lead extending from the first terminal, or (v) a second lead extending from the second terminal.

9. The device of claim 1, wherein the device has a characteristic breakdown voltage, corresponding to a minimum voltage value that, when applied to the component, causes the device to fail, and wherein the characteristic voltage value of the composition is less than the characteristic breakdown voltage.

10. A light-emitting device comprising:
a semiconductor component having semiconductive organic material and configured to emit light when a current is applied to the component;
a composition of organic polymer provided with the semiconductor component, the composition comprising a combination of conductor and/or semiconductor particles, and wherein the composition is structured to have a characteristic of (i) being a dielectric in absence of a voltage that exceeds a characteristic voltage level of the composition, and (ii) with application of the voltage exceeding the characteristic voltage level, switching into a conductor for only a duration in which the voltage is present;

wherein the composition is positioned to direct current away from the semiconductor when the composition is conductive.

11. The device of claim 10, wherein the semiconductor component is a diode.

12. The device of claim 10, wherein the device has a characteristic breakdown voltage that corresponds to a minimum voltage value that, when applied to the component, causes the device to fail, and wherein the characteristic voltage value of the composition is less than the characteristic breakdown voltage.

13. The device of claim 10, wherein the composition is applied on a substrate on which the semiconductor component is mounted.

14. The device of claim 13, wherein the composition is used to adhere the semiconductor component to the substrate.

15. The device of claim 10, wherein the semiconductor component includes a first terminal and a second terminal, and wherein the composition is in electrical contact with either or both of the first terminal and the second terminal.

16. The device of claim 15, wherein the composition extends between and contacts a first lead extending from the first terminal, and a second lead extending from the second terminal.

17. The device of claim 10, wherein the device further comprises a casing, and wherein the composition is provided with or as part of the casing.

18. A light-emitting device comprising:

a stack comprising a plurality of layers, the plurality of layers including an organic light emitter layer;

a voltage switchable material (VSD) formed from an organic polymer composition comprising a combination of conductor and/or semiconductor particles, wherein the polymer composition is coupled to the stack, wherein the VSD material is positioned to have a characteristic of (i) being a dielectric in absence of a voltage that exceeds a characteristic voltage level of the VSD material, and (ii) with application of the voltage exceeding the characteristic voltage level, switching into a conductor for only a duration in which the voltage is present;

wherein the VSD material is positioned to direct current away from the stack when in the VSD material is conductive.

19. The device of claim 18, wherein the stack includes an anode terminal and a cathode terminal on which a voltage differential is applied, and wherein the VSD material is provided in connection with one or both of the terminals.

20. The device of claim 19, wherein the cathode terminal is provided on a driver, and wherein the VSD material underlies the driver and directs current away from the stack when made conductive.

* * * * *